United States Patent [19]

Popovic et al.

[11] Patent Number: 4,634,961
[45] Date of Patent: Jan. 6, 1987

[54] METHOD AND CIRCUIT FOR THE TEMPERATURE COMPENSATION OF A HALL ELEMENT

[75] Inventors: Radivoje Popovic, Zug; Jean-Luc Berchier, Menzingen, both of Switzerland

[73] Assignee: LGZ Landis & Gyr Zug AG, Zug, Switzerland

[21] Appl. No.: 723,040

[22] Filed: Apr. 15, 1985

[30] Foreign Application Priority Data

Apr. 18, 1984 [CH] Switzerland .......................... 1939/84

[51] Int. Cl.$^4$ ............................................. H03H 5/10
[52] U.S. Cl. .................... 323/368; 323/907; 357/28
[58] Field of Search ........................ 323/294, 368, 907; 330/6; 307/309, 310; 338/32 H, 32 R; 357/28; 324/105, 117 H, 251, 252

[56] References Cited

U.S. PATENT DOCUMENTS 3,448,353 6/1969 Gallagher ............................... 357/23
4,134,030 1/1979 Pace ....................................... 307/310
4,283,643 8/1981 Levin .................................... 307/310
4,327,416 4/1982 Jerrim ............................... 324/117 H
4,371,837 2/1983 Sieverin ................................ 324/251
4,449,081 5/1984 Doemen ........................... 324/117 H
4,521,727 6/1985 Atherton et al. .................... 323/907

FOREIGN PATENT DOCUMENTS 2640082 3/1978 Fed. Rep. of Germany .
3303945 8/1983 Fed. Rep. of Germany ...... 323/294
1572426 6/1969 France .

Primary Examiner—Peter S. Wong
Assistant Examiner—Judson H. Jones
Attorney, Agent, or Firm—Marmorek Guttman & Rubenstein

[57] ABSTRACT

A circuit for providing temperature compensation to a Hall element is disclosed. The temperature compensation circuit is used to generate control signals which act on the effective thickness of the current channel of the Hall element in a manner so as to oppose changes in the effective thickness of the current channel produced by temperature variations.

14 Claims, 11 Drawing Figures

METHOD AND CIRCUIT FOR THE TEMPERATURE COMPENSATION OF A HALL ELEMENT

FIELD OF THE INVENTION

This invention relates to a method and circuit for the temperature compensation of a Hall element.

BACKGROUND OF THE INVENTION

The Hall effect occurs generally in electrically conductive materials. Briefly, a current flowing at right angles to a magnetic field generates an electric field, and hence a voltage in a direction at right angles to both the current and magnetic field. Typically, Hall effect devices are similar to conventional MOS type devices with, however, additional contact areas transverse to the source to drain current path for deriving the Hall effect voltage. Hall effect devices are typically used to measure magnetic field intensities.

German Patent DE-OS No. 26 40 082 discloses a regulating circuit for a Hall element which makes it possible to provide temperature compensation for the Hall element across a relatively narrow temperature range.

It is the object of the present invention to provide a method and circuit for the temperature compensation of a Hall element across a relatively large temperature range, for instance from −50° C. to +80° C. Desirably, the temperature dependency of the Hall element sensitivity should be limited to approximately ±0.01 percent per degree C. It is a further object of the invention to linearize the sensitivity of the Hall element as a function of the supply current across a relatively large current range, for example from 0.1 to 10 milli-amperes.

SUMMARY OF THE INVENTION

A Hall element typically includes two current terminals and one control terminal. In the case of an MOS device the two current terminals are the source and drain and the control terminal is the gate. Typically, the voltage applied to the gate controls the size of the current channel connecting the source and drain.

The sensitivity of the Hall device is the variation in Hall voltage with magnetic field per unit of current. This sensitivity depends upon the Hall coefficient $R_h$ and the effective thickness $t_{eff}$ of the current channel. The value of the effective thickness $t_{eff}$ of the current channel increases with rising temperature. Thus, the sensitivity of the Hall element changes with temperature. The electrical resistance of the Hall element also increases with rising temperature. Thus, the voltage between the two current terminals increases with rising temperature.

The effective thickness $t_{eff}$ of the current channel between the two current terminals may be controlled by the voltage applied to the control terminal which in the case of an MOS Hall element is the gate. To temperature compensate the Hall element the temperature sensitive voltage between the two current terminals is fed in as one input into a comparator circuit. The other input to the comparator circuit is a reference voltage. The output of the comparator circuit is connected to the control terminal of the Hall element.

With a rising temperature, the value of the electricl resistance of the Hall element rises and accordingly the voltage drop between the current terminals of the Hall element also rises. The increased value of voltage between the current electrodes is fed to one input of the comparator circuit. The comparator circuit then produces an output signal which when applied to the control terminal of the Hall element causes a reduction in the effective thickness $t_{eff}$ of the current channel of the Hall element. This counteracts the enlargement of the effective thickness $t_{eff}$ of the current channel of the Hall element caused by the increase in temperature so that such thickness and thus the sensitivity of the Hall element will remain constant despite the rise in temperature. By contrast, if the temperature falls then this process happens in opposite sense. This procedure also leads to the linearization of the curve relating the sensitivity of the Hall element to the current flowing in the current channel across a relatively large range of currents, for example from 0.1 to 10 milli-amps.

DETAILED DESCRIPTION OF THE INVENTION

Figure 1:
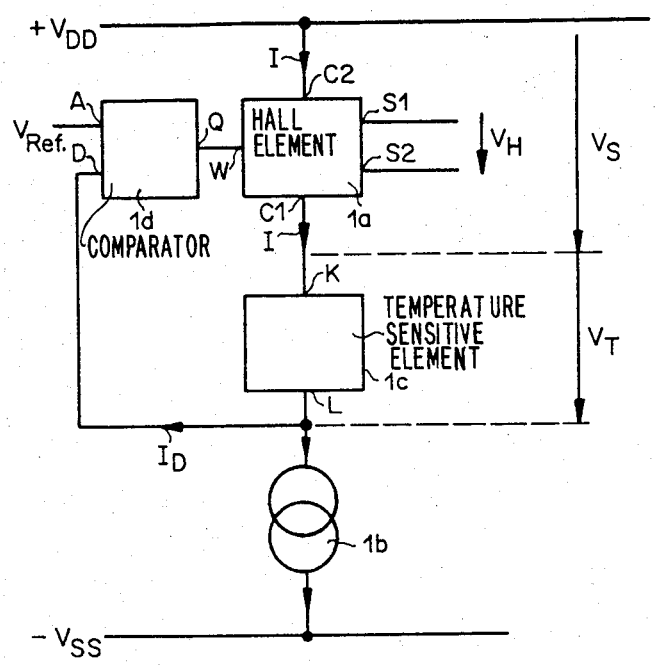
FIG. 1 is a schematic representation of a circuit for the temperature compensation of a Hall element.

Turning to FIG. 1, circuitry for providing temperature compensation to a Hall element 1a is illustrated. The circuitry of FIG. 1 comprises in addition to Hall element 1a, a current source 1b, a comparator circuit 1d and an optional temperature sensitive element 1c. The positive pole $+V_{DD}$ of a supply voltage is connected to one current terminal C2 of the Hall element while the other current terminal C1 of the Hall element is connected to the temperature sensitive element 1c. The temperature sensitive element 1c is connected to the current source 1b which current source has a terminal connected to the negative pole $-V_{SS}$ of the voltage supply. The voltage between the two current terminals of the Hall element C2, C1 is designated as $V_S$. The voltage across the temperature sensitive element 1c is designated $V_T$ and the Hall voltage measured between Hall terminals S1, S2 of the Hall element 1a is designated $V_H$. The voltage $V_S+V_T$ is fed into one input of the comparator circuit 1d. The other input of the comparator circuit 1d is a reference voltage. Note that in one particular embodiment of the invention the temperature sensitive element 1c is omitted in which case only the voltage $V_S$, i.e. the voltage between the current terminals of the Hall element is fed into the input of the comparator circuit. The output of the comparator circuit is labeled Q and this output is connected to the control terminal W of the Hall element 1a. In a particular embodiment of the invention, the Hall element 1a is a field effect device in which case the current terminals are the source and drain and the control terminal is the gate.

Figure 2:
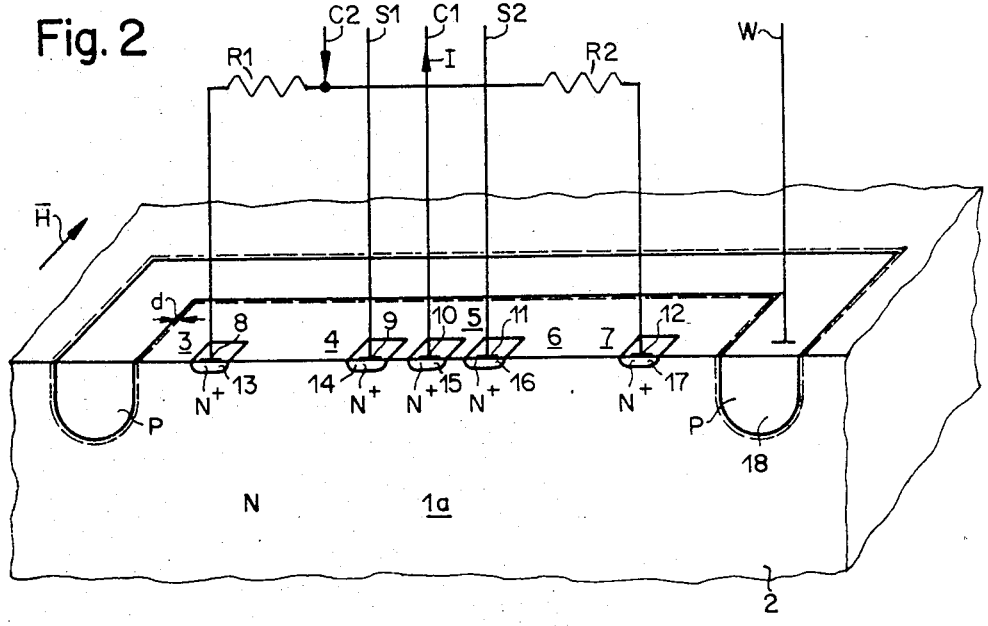
FIG. 2 is a cross sectional view of one type of Hall element.

One particular type of Hall element 1a is shown in FIG. 2. The Hall element of FIG. 2 is described in Swiss Patent Application No. 6739/83-1. The Hall element illustrated in FIG. 2 comprises a substrate 2 which illustratively is formed from N type semiconductor material. On the surface of the substrate 2 starting from the left there are arranged next to each other a first flow divider electrode 3, a first sensor electrode 4, a first current electrode 5, a second sensor electrode 6 and a second flow divider electrode 7. The electrode 5 corresponds to the current terminal C1 of FIG. 1a. The two flow divider electrodes 3 and 7 form the second current terminal of Hall element 1a of FIG. 1. The two flow divider electrodes 3 and 7 are connected to each other by means of resistances R1 and R2. The current terminal C2 is at the common terminal of the two resistances R1 and R2. When the Hall element of FIG. 2 is formed as an integrated Hall element it is advantageous to form the resistances R1 and R2 integral with the substrate 2 rather than as separate elements as shown in the figure.

The two sensor electrodes 4 and 6 and the two flow divider electrodes 3 and 7 may, for example, be arranged symmetrically with respect to the centrally located current electrode 5. The two sensor electrodes 4 and 6 correspond to the terminals S1 and S2 of the FIG. 1a from which the Hall voltage is derived.

Each electrode 3, 4, 5, 6, 7 comprises a contact 8, 9, 10, 11, 12 in addition to a diffusion layer 13, 14, 15, 16, 17. Note that all of the contact diffusion layers 13 to 17 are heavily doped with impurity atoms so that they comprise N+ type material.

The diffusion layers 13 to 17 which form the electrodes 3, 4, 5, 6, 7 are surrounded by a control electrode 18 corresponding to the control terminal W of FIG. 1a. The control electrode is of the opposite conductivity type to that of the substrate 2. Thus, since the substrate 2 is formed from N type material the control electrode is formed from P type material. The control electrode 18 has a larger diffusion depth than the contact diffusion layers 13 to 17 all of which have approximately the same diffusion depth.

The control electrode 18 is biased in such a manner that the PN junction between the control electrode 18 and the substrate 2 is reverse biased. The depletion layer thus formed as a width D has been illustrated in FIG. 2 by a dotted line. A magnetic field H which may be measured by the Hall element of FIG. 2 is oriented parallel to the surface of substrate 2 generally perpendicular to the straight line which connects the contact diffusion layers 13 to 17 with each other. The mode of operation of the Hall element of FIG. 2 is described in the aforementioned Swiss Patent Application No. 6739/83-1.

Figure 3:
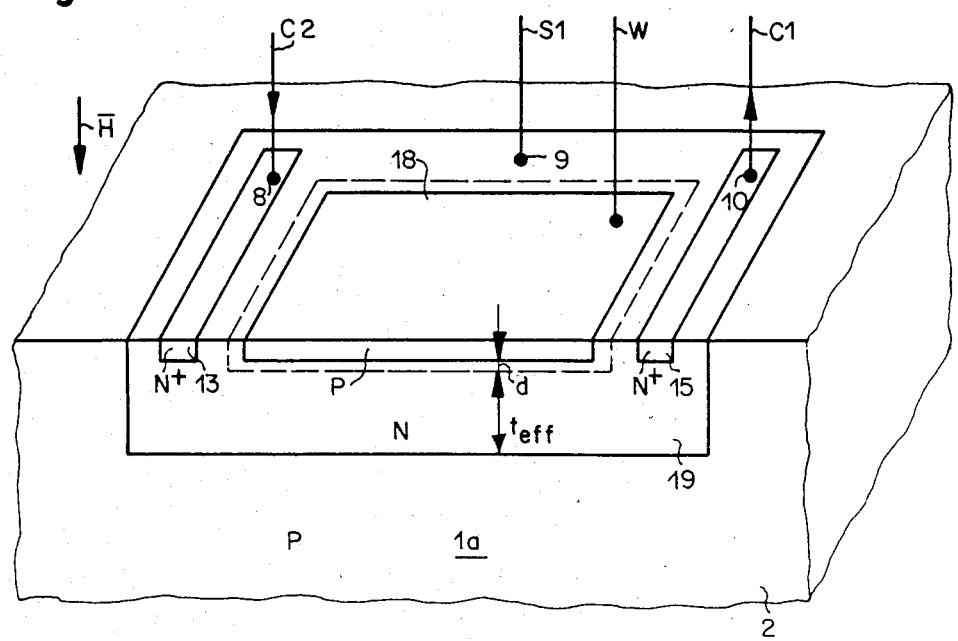
FIG. 3 is a cross sectional view of a second type of Hall element.

Turning to FIG. 3, a second type of Hall element 1a is shown. The Hall element of FIG. 3 comprises a substrate 2 which illustratively is P type semiconductor material. The substrate 2 has embedded in its surface a trough 19 comprised of N type material. On the surface of trough 19 there is embedded the control electrode 18. The control electrode 18 is formed from P type semiconductor material. A voltage is applied to the control electrode 18 via terminal W so that the PN junction which is formed between the control electrode 18 and the trough 19 is reverse biased. The depletion region associated with the reverse biased PN junction is delineated by a dotted line and the depletion region has a thickness d.

On either side of the control electrode are current electrodes 13 and 15. The current electrodes 13 and 15 are formed from N+ material. The current electrodes form the source and drain of a field effect transistor and the control electrode 18 is the gate. There is a current channel of effective thickness $t_{eff}$ extending between the current electrodes 13 and 15. The thickness $t_{eff}$ of the current channel depends upon the biasing voltage applied to the control electrode because the larger the depletion region d the smaller the effective thickness of the current channel. Note that terminal C2 of the Hall element 1a is connected to the N+ region 13 by way of contact 8 and the terminal C1 of Hall element 1a is connected to the N+ region 15 by way of contact 10.

The Hall element of FIG. 3 also includes two other N+ regions which are located in the space between region 13 and region 15 along the two remaining sides of the control electrode 18. A contact 9 to one of these regions is shown. The contact 9 corresponds to the terminal S1 of Hall element 1a which is used to derive the Hall voltage. A similar contact is on the opposite side of the control electrode 18, however this is not shown in the cross sectional view of the Hall element of FIG. 3. The magnetic field which may be measured by the Hall element in FIG. 3 is oriented perpendicular to the surface of substrate 2.

Figure 4:
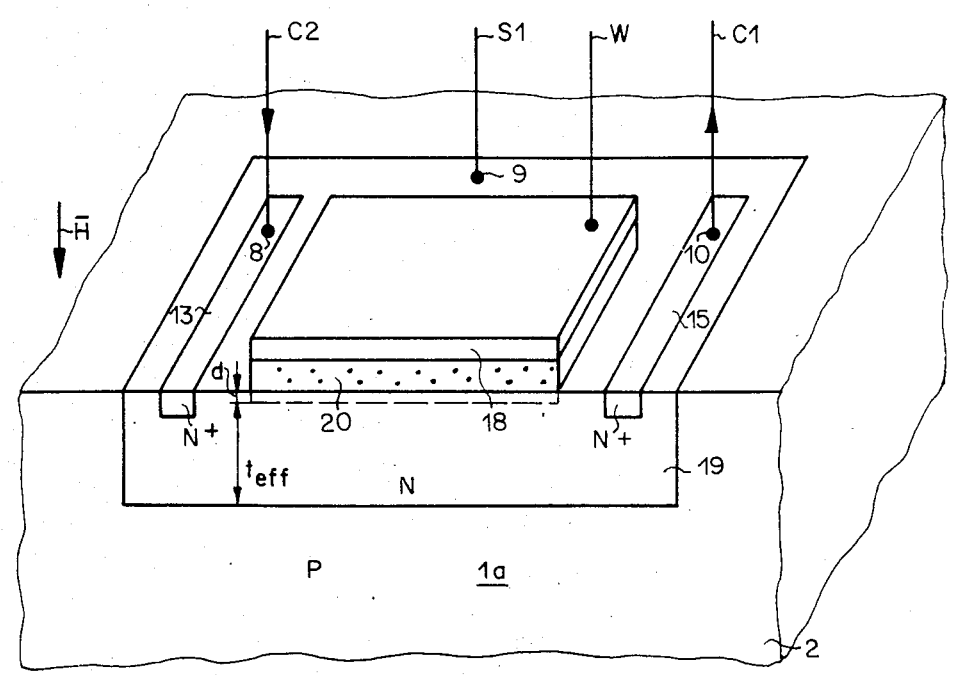
FIG. 4 is a cross sectional view of a third type of Hall element.

A third embodiment of the Hall element 1a of FIG. 1 is shown in FIG. 4. The Hall element of FIG. 4 is similar to the Hall element of FIG. 3 with the exception that the control electrode 18 is not embedded in trough 19. Instead, the control electrode is formed by depositing a region of metal or polysilicon material 18 which is separated from the surface of the trough 19 by a thin insulating layer 20. The insulating layer 20 may, for example, consist of $SiO_2$. Thus the Hall element of FIG. 4 is an MOS device. Depending on the voltage applied to the control electrode 18 on line W a charge depletion or a charge enhancement region of thickness d is formed in trough 19 immediately below the insulating layer 20. The thickness of the enhancement or depletion region is designated d in FIG. 4. N+ regions 13 and 15 serve as current electrodes. A channel of effective thickness $t_{eff}$ connects the current terminals 13 and 15 which terminals generally form the source and/or drain of the MOS device. The effective thickness of the current channel depends upon the voltage applied to the control electrode along line W. As in FIG. 3, the device of FIG. 4 also includes two Hall electrodes from which the Hall voltage is derived. Neither of these N+ regions is shown in FIG. 4, however these Hall electrodes extend between the N+ regions 13 and 15 along opposite sides of the control electrode. A contact 9 to one of the Hall electrodes is shown in FIG. 4. The other control electrode is in front of the cutting plane of the device of FIG. 4 and thus is not shown. The terminal connections in FIG. 4, C2, C1, S1 and W correspond to the like labeled connections of FIG. 1.

FIGS. 5, 6, 7 and 8 show different forms of the comparator circuit 1d of FIG. 1. Each of the comparator circuits in FIGS. 5 through 8 has an input designated A for a reference voltage and an input designated D which receives the voltage $V_S$ between the current terminals of the Hall element 1a and the voltage $V_T$ across the optional temperature sensitive element 1c also known in FIG. 1. Each of the comparator circuits of FIGS. 5 through 8 has an output Q which output is applied to the control terminal W of the Hall element.

Figure 5:
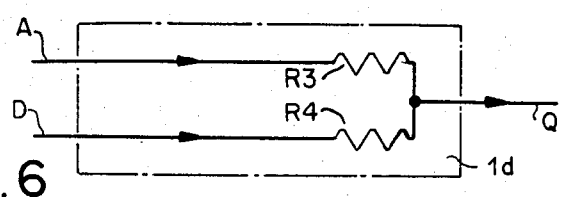
FIG. 5 shows a schematic of a first type of comparator circuit.

The comparator circuit of FIG. 5 comprises two resistances R3 and R4 whose common terminal Q forms the output of the comparator circuit. The amplification factor of this control circuit is smaller than 1.

Figure 6:
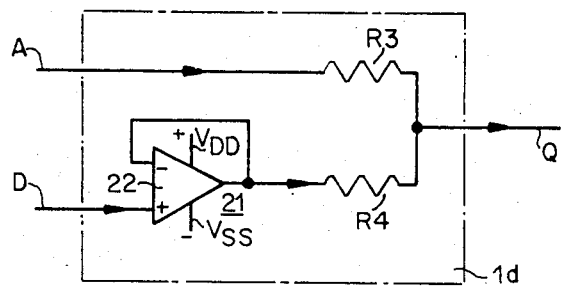
FIG. 6 shows a second type of comparator circuit.

The comparator circuit of FIG. 6 corresponds approximately to the circuit illustrated in FIG. 5 with the exception that a voltage follower 21 is switched between the input D and the corresponding resistance R4. The voltage follower circuit 21 is formed from operational amplifier 22 whose output is connected by means of a short circuit connection to its inverting input. The non-inverting input of the operational amplifier 22 forms the input D of the voltage follower 21. It is desirable to use the voltage follower 21 because the voltage follower 21 has a very high input impedance so that the input D draws very little current. Nevertheless, the amplification factor of the voltage follower 21 is smaller than 1.

Figure 7:
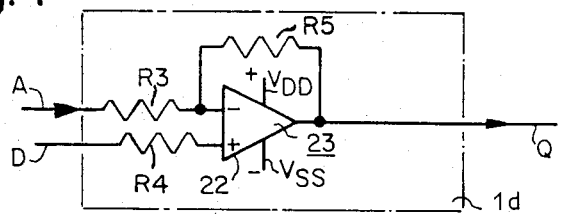
FIG. 7 shows a third type of comparator circuit.

Turning to FIG. 7, the comparator circuit 1d shown therein comprises a difference amplifier or subtractor circuit 23. The difference amplifier 23 is formed from an operational amplifier 22 and a feedback resistance R5. The feedback resistor R5 is connected to the inverting input of the operational amplifier 22. The input D is connected by way of resistance R4 to the non-inverting input of the operational amplifier 22. The reference voltage at input A is connected by way of resistance R3 to the inverting input of operational amplifier 22. The amplification factor of the comparator circuit of FIG. 7 may be larger than 1. Note that in FIGS. 6 and 7 the operational amplifiers 22 are in each case powered by the supply voltage $+V_{DD}$; $-V_{SS}$.

Figure 8:
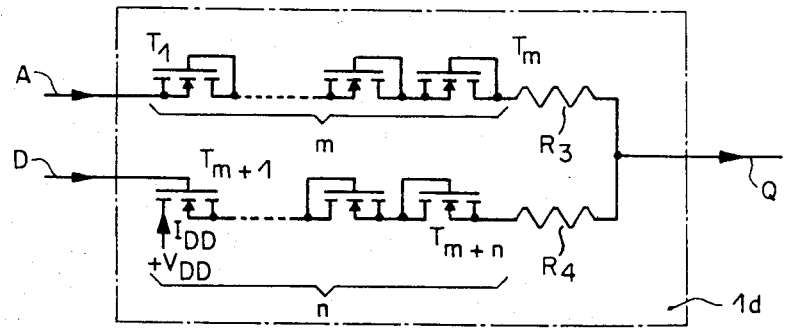
FIG. 8 shows a fourth type of comparator circuit.

The comparator circuit of FIG. 8 generally corresponds to the circuit of FIG. 5. However, in the circuit of FIG. 8 a plurality of m MOS transistors $T_1 \ldots T_m$ is connected between the input A and resistance R3. Similarly a plurality of n MOS transistors $T_{m+1} \ldots T_{m+n}$ is connected between the input D and the resistance R4. The input voltage at terminal D is applied to the gate of the transistor $T_{m+1}$ while the source of transistor $T_{m+1}$ is connected to the positive pole $V_{DD}$ of the supply voltage $V_{DD}$, $-V_{SS}$. The transistors $T_1 \ldots T_m$, $T_{m+1} \ldots T_{m+n}$ are assumed to be generally identical N-Channel enhancement mode MOS transistors. Since the gate input of an MOS transistor has a high impedance the input current $I_D$ to the gate of transistor $T_{m+1}$ is very small. Similarly the input current $I_{DD}$ supplied to the source of transistor $T_{m+1}$ by the voltage source $+V_{DD}$, $-V_{SS}$, is also small, even when the resistances R3, R4 are relatively small.

If the integer values m and n are selected in such a way so that the equation mR4=nR3 is met, then the comparator circuit 1d is approximately independent of temperature.

Figure 9:
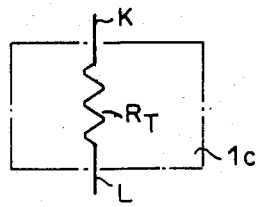
FIG. 9 shows a temperature sensitive element for use in connection with the circuit of FIG. 1.
Figure 10:
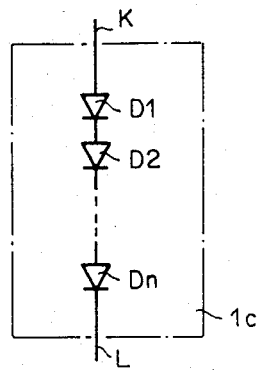
FIG. 10 shows a second type of temperature sensitive element for use in connection with the circuit of FIG. 1.

FIGS. 9 and 10 each illustrates a form of the temperature sensitive element 1c of FIG. 1. In FIG. 9 the temperature sensitive element is a temperature sensitive resistor $R_T$. In FIG. 10 the temperature sensitive element is a plurality of n series connected diodes $D_1$, $D_2$ ... $D_n$, which diodes are biased so as to be conducting. In both FIGS. 9 and 10 the terminals of the temperature sensitive element are represented by the letters K and L. In some embodiments of the invention the temperature sensitive element 1c is entirely omitted. In this case the temperature sensitive element 1c of FIG. 1 is replaced by a wire.

Figure 11:
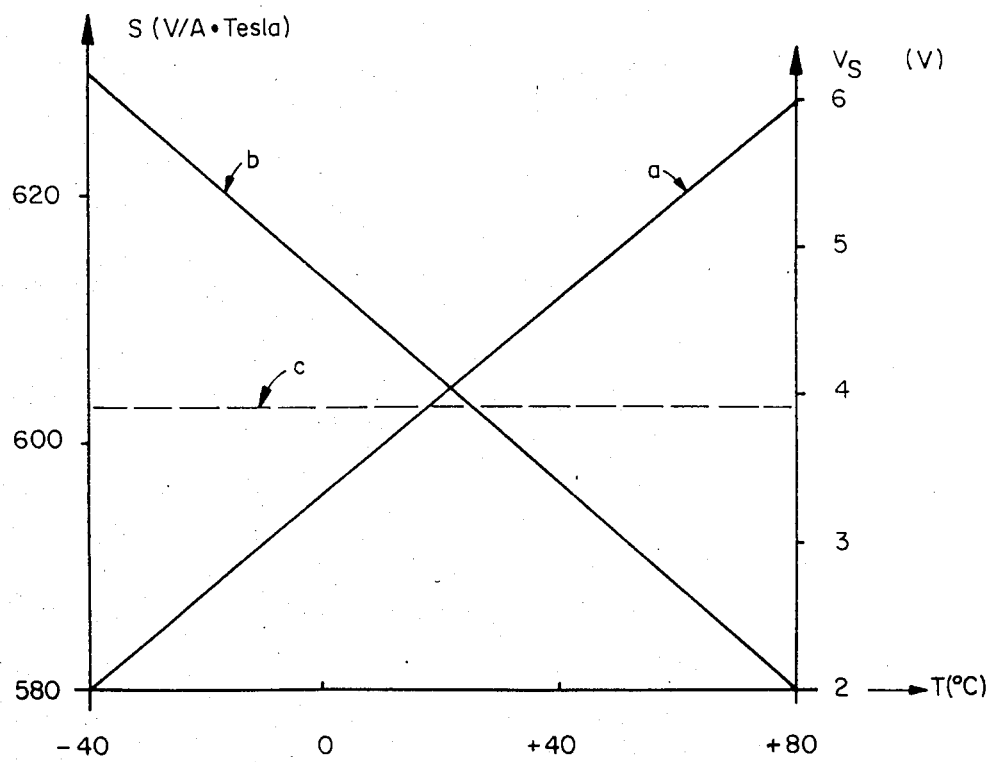
FIG. 11 shows several characteristics of a Hall element as a function of temperature.

FIG. 11 shows three characteristic curves a, b, and c. The curve a is an approximate plot of the voltage drop $V_S$ betwen current terminals of the Hall element 1a of FIG. 1 as a function of temperature. The characteristic curve b is an approximate plot of the sensitivity S of the Hall element as a function of temperature when no temperature compensation circuitry is provided. The curve c is an approximate plot of the sensitivity S of the Hall element as a function of temperature when temperature compensation circuitry is provided, in accordance with the present invention. Note that voltage $V_S$ increases with temperature, while the sensitivity S of the Hall element decreases with temperature if no means for temperature compensation is provided. As indicated by curve c, the sensitivity S is approximately independent of temperature if suitable temperature compensation circuitry is provided. As previously indicated the sensitivity S of the Hall element is the variation in Hall voltage $V_H$ with magnetic field per unit of current I.

Operation of the temperature compensation circuitry may be understood from the following.

The Hall element 1a represented in FIG. 1a is fed with current by the current source 1b. The following equations apply for the Hall element 1a:

$$V_H = (R_H/t_{eff})IB \qquad (1),$$

$$S = (\partial V_H/\partial B)/I = R_H/t_{eff} \qquad (2) \text{ and}$$

$$V_S = \rho I$$

wherein the individual parameters have the following significance:
 $V_H$: Hall voltage,
 $R_H$: Hall coefficient,
 $t_{eff}$: effective thickness of Hall element 1a,
 I: current flowing between the current terminals of the Hall element
 B: intensity of the magnetic field H to be measured,
 S: sensitivity of Hall element 1a per unit of current
 $V_S$: voltage drop between the current terminals of the Hall element
 $\rho$: electric resistance of Hall element 1a.

Under the influence of temperature T, the main changes are in the value of electric resistance and in the value of the effective thickness $t_{eff}$. Here the value of electric resistance and the value of the effective thickness $t_{eff}$ increase with rising temperature. If the sensitivity S of Hall element 1a, which according to the characteristic curve b of FIG. 11 decreases with increasing temperature, is to be temperature-compensate i.e. be kept constant at a variable temperature T, then the effective thickness $t_{eff}$ of Hall element 1a is to be kept approximately constant. This is accomplished by means of the control terminal W. The voltage applied to the control terminal W acts on the effective thickness of the current channel so as to oppose changes in the effective thickness caused by variations in temperature.

The control signals applied to the control terminal W are generated by the comparator circuit 1d. The comparator circuit 1d has as one input (A of FIG. 1) a reference voltage $V_{Ref}$. The other input to the comparator circuit comprises at least the voltage drop $V_S$ originated in the Hall element by the supply current I. If a temperature sensitive element 1c is included the input to the comparator circuit comprises $V_S + V_T$ where $V_T$ is the voltage drop across the temperature sensitive element. The output Q of the comparator circuit 1d, which is connected to control terminal W of Hall element 1a acts on the effective thickness $t_{eff}$ of Ha 1 element 1a so as to oppose change in $t_{eff}$ caused by variations in temperature. This serves to keep $t_{eff}$ approximately constant and thereby the sensitivity S of Hall element 1a becomes approximately independent from temperature T.

With a rising temperature, the value of electric resistance rises and, according to equation (3) the voltage $V_S$ also rises. The increased value of voltage drop $V_S$ originating with the rising temperature T is compared in the comparator circuit 1d with the reference value $V_{Ref}$. The comparator circuit produces a control signal at its output Q which causes a diminution of the effective thickness $t_{eff}$ of Hall element 1a. This counteracts the enlargement of the effective thickness $t_{eff}$ of the Hall element 1a caused by the increasing temperature T so that such thickness, and thereby also the sensitivity S of the Hall element 1a will remain constant despite the rising temperature T. By contrast, if the temperature T falls, then the same happens in the opposite sense.

A temperature coefficient for the sensitivity S of a Hall element 1a of approximately ±0.01% per °C. can be obtained over a relatively large temperature range, such as from −50° C. to +80° C. when the present invention issued.

The effective thickness $t_{eff}$ of Hall element 1a also depends on supply current I. Since the voltage drop $V_S$ is not only a function of the temperature but according to equation (3) also a function of the supply current I, the comparator circuit 1d also removes the influence of variations in supply current I, so that the dependency of the effective thickness $t_{eff}$, and thereby also the dependency of the sensitivity S of Hall element 1a on the supply current I is substantially reduced. This leads to linearization of the sensitivity S of Hall element 1a as a function of the supply current I across a relatively large current range, for example from 0.1 to 10 mA.

Finally, the above described embodiments of the invention are intended to be illustrative only. Numerous alternative embodiments may be devised by those skilled in the art without departing from the spirit and scope of the following claims.

We claim:

1. A method for providing temperature compensation to a Hall element, said Hall element comprising two current terminals and at least one control terminal, said Hall element defining a current flow channel between said current terminals, said current channel having an effective thickness $t_{eff}$, said method comprising the steps of:
   comparing at least the voltage between said current terminals with a reference voltage to generate a control signal, and
   applying said control signal to said control terminal said control signal acting on said effective thickness so as to oppose changes in said effective thickness $t_{eff}$ caused by variations in temperature, whereby said effective thickness $t_{eff}$ is maintained approximately independent of temperature.

2. The method of claim 1 wherein the voltage compared with said reference voltage comprises the voltage between said current terminals and the voltage across a temperature sensitive element.

3. A circuit for providing temperature compensation to a Hall element which receives current from a current source, said Hall element comprising two current terminals and one control electrode, said Hall element defining a current flow channel between said current terminals, said current channel having an effective thickness $t_{eff}$, said circuit comprising
   comparator means for receiving at one input a voltage including at least the voltage between said current terminals and for generating control signals in response thereto, and
   means for applying said control signals to said control terminal, said control signals acting on said effective thickness $t_{eff}$ to oppose changes in said effective thickness $t_{eff}$ caused by variations in temperature so as to maintain said effective thickness $t_{eff}$ independent of temperature.

4. The circuit of claim 3 wherein said current terminals are formed as contact diffusion layers in a semiconductor substrate, said contact diffusion layers being surrounded by a ring-shaped control electrode, said ring-shaped control electrode having a conductivity opposite to that of said substrate, said control electrode having a greater diffusion depth than said contact diffusion layers, the P-N junction formed between said substrate and said control electrode being reverse biased.

5. The circuit of claim 3 wherein said Hall element comprises,
   a semiconductor substrate of a first conductivity type,
   a trough formed in said substrate, said trough having a conductivity type opposite to that of said substrate,
   a first pair of elongated parallel spaced apart electrodes embedded within said trough, said first pair of electrodes being current electrodes,
   a control electrode embedded within said trough between said first pair of electrodes, said control electrode having a conductivity type opposite to that of said trough, the P-N junction formed between said control electrode and said trough being reverse biased, and
   a second pair of elongated parallel spaced apart current electrodes embedded within said trough, the Hall voltage of said Hall element being measurable across said second pair of electrodes.

6. The circuit of claim 3 wherein said Hall element comprises
   a semiconductor substrate of a first conductivity type,
   a trough of opposite conductivity type formed in said substrate,
   a first pair of elongated parallel spaced apart electrodes embedded within said trough, said first pair of electrodes being current electrodes,
   an insulating layer formed on the surface of said trough between said first pair of electrodes,
   a conducting layer formed on top of said insulating layer, said insulating layer and said conducting layer forming a gate, and
   a second pair of elongated spaced apart parallel electrodes, the Hall voltage of said Hall element being measurable between said second pair of electrodes.

7. The circuit of claim 3 wherein said comparator means comprises a first terminal for receiving a reference voltage, a second terminal for receiving at least said voltage between said current terminals, a first resistor connected to said first terminal, and a second resistor connected to said second terminal, said first and second resistors having a common pole, said control signals being available at said common pole.

8. The circuit of claim 7 wherein said comparator circuit comprises a voltage follower connected between said second terminal and said second resistor.

9. The circuit of claim 7 wherein a plurality of m MOS transistors ($T_1 \ldots T_m$) is connected between said first terminal and said first resistor and wherein a plurality of n MOS transistors ($T_{m+1} \ldots T_{m+n}$) is connected between said second terminal and said second resistor, said second terminal being connected to the gate of the first of said n transistors ($T_{m+1}$).

10. The circuit of claim 9 wherein said first resistance has a value R3 and said second resistance has a value of R4 and wherein m and n are selected so that mR4=nR3.

11. The circuit of claim 3 wherein said comparator means comprises a differential amplifier said differential amplifier comprising an operational amplifier and a feedback resistor connecting the output of said operational amplifier to the inverting input of the operational amplifier, said reference voltage being connected to the said inverting input by way of a first resistor, at least said voltage between said current terminals being connected to the non-inverting input of said operational amplifier by way of a second resistor.

12. The circuit of claim 3 wherein said circuit further comprises a temperature sensitive element connected to one of the current terminals of said Hall element, and wherein said comparator receives at one input the voltage between said current terminals and the voltage across said temperature sensitive element.

13. The circuit of claim 12 wherein said temperature sensitive element comprises a resistor.

14. The circuit of claim 12 wherein said temperature sensitive element comprises a plurality of diodes connected in series.

* * * * *